United States Patent
Ikeda et al.

(10) Patent No.: US 8,582,899 B2
(45) Date of Patent: Nov. 12, 2013

(54) IMAGE CODING APPARATUS AND METHOD, IMAGE DECODING APPARATUS AND METHOD, AND PROGRAM

(75) Inventors: Hiroshi Ikeda, Kanagawa (JP); Yuji Wada, Tokyo (JP); Kazuhiro Shimauchi, Tokyo (JP)

(73) Assignee: Sony Corporation, Tokyo (JP)

( * ) Notice: Subject to any disclaimer, the term of this patent is extended or adjusted under 35 U.S.C. 154(b) by 297 days.

(21) Appl. No.: 13/023,830

(22) Filed: Feb. 9, 2011

(65) Prior Publication Data

US 2011/0229048 A1   Sep. 22, 2011

(30) Foreign Application Priority Data

Mar. 16, 2010   (JP) ................................. 2010-059118

(51) Int. Cl.
*G06K 9/36* (2006.01)
(52) U.S. Cl.
USPC ......................................................... 382/232
(58) Field of Classification Search
USPC .................................. 382/232–253
See application file for complete search history.

(56) References Cited

U.S. PATENT DOCUMENTS

2003/0063810 A1* 4/2003 Chebil .......................... 382/240
2006/0273939 A1* 12/2006 Tanaka et al. .................. 341/67

FOREIGN PATENT DOCUMENTS

JP   2002-204357   7/2002
JP   2004-260539   9/2004

OTHER PUBLICATIONS

U.S. Appl. No. 13/442,199, filed Apr. 9, 2012, Wada.

* cited by examiner

*Primary Examiner* — Alex Liew
(74) *Attorney, Agent, or Firm* — Oblon, Spivak, McClelland, Maier & Neustadt, L.L.P.

(57) ABSTRACT

An image coding apparatus includes a significant bit detection processing unit that detects a number of pieces of coefficient data where a significant bit is detected on a higher-order bit plane for each bit plane from coefficient data generated by performing a frequency transform on image data, a coding selection unit that selects a variable-length coding or a fixed-length coding for each bit plane on the basis of the number of pieces of coefficient data and a bit depth of the bit plane, a variable-length coding unit that performs a variable-length coding on the bit plane where the variable-length coding is selected, and a fixed-length coding unit that performs a fixed-length coding on the bit plane where the fixed-length coding is selected.

4 Claims, 17 Drawing Sheets

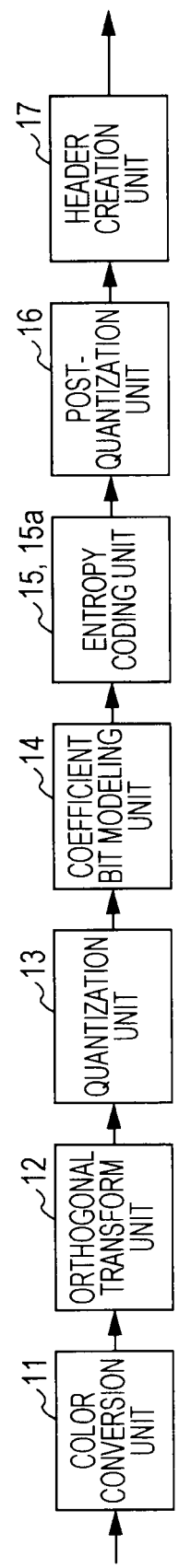

FIG. 2A

| MSB | 0 | 0 | 0 | 0 | 0 | 0 | 0 | 0 |
|---|---|---|---|---|---|---|---|---|
|  | 0 | 0 | 0 | 0 | 0 | 0 | 0 | 0 |
|  | 0 | 0 | 0 | 0 | 1 | 0 | 0 | 0 |
|  | 0 | 1 | 0 | 0 | 0 | 0 | 0 | 0 |
|  | 1 | 0 | 0 | 1 | 0 | 1 | 0 | 0 |
|  | 0 | 1 | 1 | 0 | 0 | 0 | 0 | 0 |
|  | 1 | 0 | 0 | 0 | 1 | 1 | 1 | 0 |
| LSB | 0 | 0 | 1 | 1 | 0 | 0 | 0 | 0 |
|  | 10 | 20 | 5 | 9 | 34 | 18 | 2 | 10 |

FIG. 2B

| | CODE BLOCK 0 | | | | CODE BLOCK 1 | | | | |
|---|---|---|---|---|---|---|---|---|---|
| MSB | 0 | 0 | 0 | 0 | 0 | 0 | 0 | 0 | BIT DEPTH 0 |
|  | 0 | 0 | 0 | 0 | 0 | 0 | 0 | 0 | BIT DEPTH 1 |
|  | 0 | 0 | 0 | 0 | 1 | 0 | 0 | 0 | BIT DEPTH 2 |
|  | 0 | 1 | 0 | 0 | 0 | 0 | 0 | 0 | BIT DEPTH 3 |
|  | 1 | 0 | 0 | 1 | 0 | 1 | 0 | 0 | BIT DEPTH 4 |
|  | 0 | 1 | 1 | 0 | 0 | 0 | 0 | 0 | BIT DEPTH 5 |
|  | 1 | 0 | 0 | 0 | 1 | 1 | 1 | 0 | BIT DEPTH 6 |
| LSB | 0 | 0 | 1 | 1 | 0 | 0 | 0 | 0 | BIT DEPTH 7 |
|  | 10 | 20 | 5 | 9 | 34 | 18 | 2 | 10 | |

FIG. 7A

| BIT PATTERN | CODE | BIT LENGTH |
|---|---|---|
| 0000 | 01 | 2 |
| 0001 | 101 | 3 |
| 0010 | 0001 | 4 |
| 0011 | 1101 | 4 |
| 0100 | 111 | 3 |
| 0101 | 00101 | 5 |
| 0110 | 00001 | 5 |
| 0111 | 000001 | 6 |
| 1000 | 100 | 3 |
| 1001 | 00111 | 5 |
| 1010 | 00110 | 5 |
| 1011 | 001001 | 6 |
| 1100 | 1100 | 4 |
| 1101 | 0000001 | 7 |
| 1110 | 001000 | 6 |
| 1111 | 0000000 | 7 |

FIG. 7B

| BIT PATTERN | CODE | BIT LENGTH |
|---|---|---|
| 0000 | 011 | 3 |
| 0001 | 0001 | 4 |
| 0010 | 0011 | 4 |
| 0011 | 1001 | 4 |
| 0100 | 0000 | 4 |
| 0101 | 1101 | 4 |
| 0110 | 1011 | 4 |
| 0111 | 00101 | 5 |
| 1000 | 111 | 3 |
| 1001 | 1000 | 4 |
| 1010 | 1010 | 4 |
| 1011 | 00100 | 5 |
| 1100 | 0101 | 4 |
| 1101 | 01001 | 5 |
| 1110 | 1100 | 4 |
| 1111 | 01000 | 5 |

IMAGE CODING APPARATUS AND METHOD, IMAGE DECODING APPARATUS AND METHOD, AND PROGRAM

BACKGROUND OF THE INVENTION

1. Field of the Invention

The present invention relates to an image coding apparatus and method, an image decoding apparatus and method, and a program. In particular, sense of discomfort or sense of obscurity generated in the image which is caused by the post-quantization is suppressed.

2. Description of the Related Art

Up to now, as an image compression system, a system called JPEG2000 or JPEG XR (Joint Photographic Experts Group eXtended Range) is used with which an image with a high quality and a high gradation can be obtained even when a compression ratio is increased. Also, an image decoding apparatus that performs a decoding on the image compressed in the above-mentioned system is disclosed, for example, in Japanese Unexamined Patent Application Publication No. 2004-260539 and Japanese Unexamined Patent Application Publication No. 2002-204357.

SUMMARY OF THE INVENTION

Incidentally, according to the system of JPEG2000, a frequency transform for transforming a pixel value from space coordinates into frequency coordinates and a quantization of the coefficient data obtained through the frequency transform are carried out. Furthermore, to make it possible to efficiently code the quantized coefficient data, a coefficient bit modeling in which a processing of expanding the coefficient data into a bit plane or the like, an entropy coding for the data subjected to the processing of the coefficient bit modeling, or the like is carried out.

Also, in the entropy coding, a coding in which a variable-length coding and a fixed-length coding are combined with each other is performed. A scanning from an MSB (Most Significant Bit) side towards an LSB (Least Significant Bit) side is performed, and the variable-length coding is performed for a bit plane below a certain depth from a bit depth where a bit "1" is generated for the first time. Furthermore, the fixed-length coding is performed for a bit plane at and above the certain depth. In this manner, segmentation between the variable-length coding and the fixed-length coding is carried out depending on whether or not the depth is at or above the certain depth irrespective of a characteristic of the input coefficient data. Therefore, a case may occur in which the segmentation between the variable-length coding and the fixed-length coding is not set as an optimum position, and it is difficult to steadily enhance a coding efficiency.

In view of the above, according to an embodiment of the present invention, it is desirable to provide an image coding apparatus and method, an image decoding apparatus and method, and a program with which the coding efficiency is enhanced, and it is possible to suppress the sense of discomfort or the sense of obscurity generated in the image which is caused by the post-quantization.

An image coding apparatus according to an embodiment of the present invention includes: a significant bit detection processing unit that detects a number of pieces of coefficient data where a significant bit is detected on a higher-order bit plane for each bit plane from coefficient data generated by performing a frequency transform on image data; a coding selection unit that selects a variable-length coding or a fixed-length coding for each bit plane on the basis of the number of pieces of coefficient data and a bit depth of the bit plane; a variable-length coding unit that performs a variable-length coding on the bit plane where the variable-length coding is selected; and a fixed-length coding unit that performs a fixed-length coding on the bit plane where the fixed-length coding is selected.

According to the embodiment of the present invention, the detection is performed on the number of pieces of coefficient data where the significant bit is detected on the higher-order bit plane for each bit plane from the coefficient data generated by performing the frequency transform on the image data. Also, a selection of the coding may be performed in sequence from a shallower bit depth, the fixed-length coding may be selected for the bit plane where the bit depth is larger than or equal to a first threshold and/or the number of pieces of coefficient data on a bit plane by one higher-order is larger than or equal to a second threshold, and the variable-length coding may be selected for the other bit plane to perform the coding on the bit plane.

An image coding method according to another embodiment of the present invention includes the steps of: detecting a number of pieces of coefficient data by a significant bit detection processing unit where a significant bit is detected on a higher-order bit plane for each bit plane from coefficient data generated by performing a frequency transform on image data; selecting a variable-length coding or a fixed-length coding for each bit plane by a coding selection unit on the basis of the number of pieces of coefficient data and a bit depth of the bit plane; performing a variable-length coding by a variable-length coding unit on the bit plane where the variable-length coding is selected; and performing a fixed-length coding by a fixed-length coding unit on the bit plane where the fixed-length coding is selected.

A program according to another embodiment of the present invention causes a computer to execute a processing including: detecting a number of pieces of coefficient data where a significant bit is detected on a higher-order bit plane for each bit plane from coefficient data generated by performing a frequency transform on image data; selecting a variable-length coding or a fixed-length coding for each bit plane on the basis of the number of pieces of coefficient data and a bit depth of the bit plane; performing a variable-length coding on the bit plane where the variable-length coding is selected; and performing a fixed-length coding on the bit plane where the fixed-length coding is selected.

An image decoding apparatus according to another embodiment of the present invention includes: a variable-length decoding unit that performs a variable-length decoding on coded data where a coding is performed while selecting a variable-length coding or a fixed-length coding for each bit plane on the basis of a number of pieces of coefficient data where a significant bit is detected on a higher-order bit plane and a bit depth of the bit plane with respect to coefficient data generated by performing a frequency transform on image data; a fixed-length decoding unit that performs a fixed-length decoding on the coded data; a significant bit detection processing unit that detects a number of pieces of coefficient data where a significant bit is detected on a higher-order bit plane on the bit plane obtained by decoding the coded data; and a decoding selection unit that selects and causes the variable-length decoding unit or the fixed-length decoding unit to perform the decoding on the coded data on the basis of the number of pieces of coefficient data and the bit depth of the bit plane.

According to the embodiment of the present invention, the decoding is performed on the coded data where the coding is performed while selecting the variable-length coding or the fixed-length coding for each bit plane on the basis of the number of pieces of coefficient data where the significant bit is detected on the higher-order bit plane and the bit depth of the bit plane with respect to the coefficient data generated by performing the frequency transform on the image data, and the detection is performed on the number of pieces of coefficient data where the significant bit is detected on the higher-order bit plane on the obtained bit plane. Also, a selection of the decoding may be performed in sequence from a shallower bit depth, the fixed-length decoding may be selected in a case where the bit depth is larger than or equal to a first threshold and/or the number of pieces of coefficient data on a bit plane by one higher-order is larger than or equal to a second threshold, and the variable-length decoding may be selected in the other case to perform the decoding on the coded data.

An image decoding method according to another embodiment of the present invention includes the steps of: performing a variable-length decoding by a variable-length decoding unit on coded data where a coding is performed while selecting a variable-length coding or a fixed-length coding for each bit plane on the basis of a number of pieces of coefficient data where a significant bit is detected on a higher-order bit plane and a bit depth of the bit plane with respect to coefficient data generated by performing a frequency transform on image data; performing a fixed-length decoding by a fixed-length decoding unit on the coded data; detecting, by a significant bit detection processing unit, a number of pieces of coefficient data where a significant bit is detected on a higher-order bit plane on the bit plane obtained by decoding the coded data; and selecting and causing the variable-length decoding unit or the fixed-length decoding unit to perform the decoding on the coded data on the basis of the number of pieces of coefficient data and the bit depth of the bit plane by a decoding selection unit.

A program according to another embodiment of the present invention causes a computer to execute a processing including: performing a variable-length decoding on coded data where a coding is performed while selecting a variable-length coding or a fixed-length coding for each bit plane on the basis of a number of pieces of coefficient data where a significant bit is detected on a higher-order bit plane and a bit depth of the bit plane with respect to coefficient data generated by performing a frequency transform on image data; performing a fixed-length decoding on the coded data; detecting a number of pieces of coefficient data where a significant bit is detected on a higher-order bit plane on the bit plane obtained by decoding the coded data; and selecting and causing the variable-length decoding unit or the fixed-length decoding unit to perform the decoding on the coded data on the basis of the number of pieces of coefficient data and the bit depth of the bit plane.

It should be noted that the program according to the embodiment of the present invention is, for example, a computer program that can be provided to a general-use computer system capable of executing various program codes by a storage medium provided in a computer-readable format or a communication medium, for example, a storage medium such as an optical disk, a magnetic disk, or a semiconductor memory or a communication medium such as a network. By providing such a program in a computer-readable format, the processing in accordance with the program on the computer system is realized.

According to the embodiment of the present invention, the coefficient data generated is generated by performing the frequency transform on the image data, and the number of pieces of coefficient data where the significant bit is detected on the higher-order bit plane for each bit plane is detected from this coefficient data. Also, on the basis of the number of pieces of coefficient data thus detected and the bit depth of the bit plane, the generation of the coded data is performed by performing the variable-length coding or the fixed-length coding for each bit plane. Also, in the decoding on this coded data, on the basis of the number of pieces of coefficient data where the significant bit is detected on the higher-order bit plain on the bit plane obtained by decoding the coded data and the bit depth of the bit plane, the variable-length decoding or the fixed-length decoding is performed. Therefore, as the segmentation between the variable-length coding and the fixed-length coding can be carried out in accordance with the characteristic of the input coefficient data, it is difficult to steadily enhance the coding efficiency, and it is possible to suppress the sense of discomfort or the sense of obscurity generated in the image which is caused by the post-quantization.

BRIEF DESCRIPTION OF THE DRAWINGS

FIG. 1 illustrates a schematic configuration of an image coding apparatus according to an embodiment of the present invention;

FIGS. 2A and 2B are explanatory diagrams for describing a coefficient bit modeling in one dimension;

FIGS. 7A and 7B exemplify coding tables;

DESCRIPTION OF THE PREFERRED EMBODIMENTS

Figure 3:
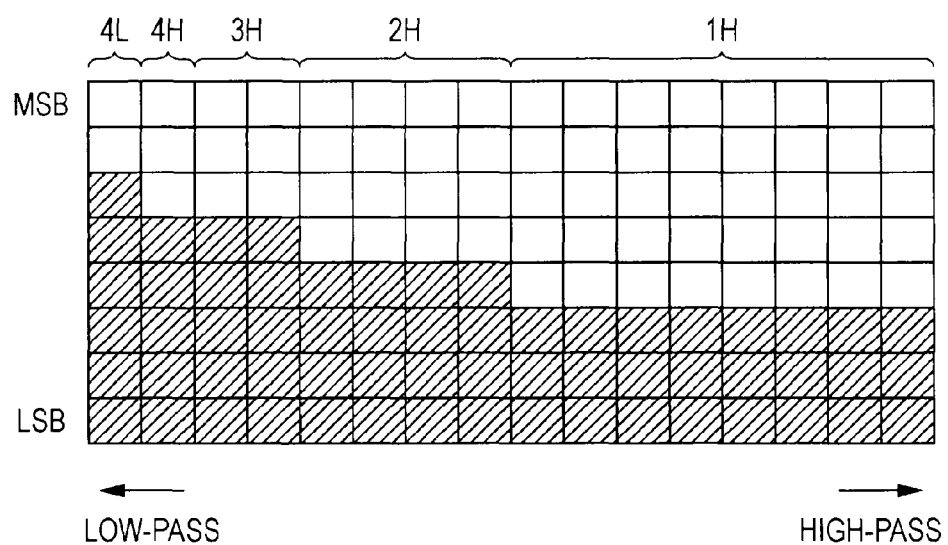
FIG. 3 exemplifies a size of coefficient data.

Hereinafter, embodiments for carrying out the invention will be described. It should be noted that the description will be given in the following order.

1. First embodiment
   1-1. Configuration of Image Coding Apparatus
   1-2. Configuration of Entropy Coding Unit
   1-3. Operation of Entropy Coding Unit
   1-4. Configuration of Image Decoding Apparatus
   1-5. Configuration of Entropy Decoding Unit
   1-6. Operation of Entropy Decoding Unit
2. Second embodiment
   2-1. Configuration of Entropy Coding Unit 2-2. Operation of Entropy Coding Unit
2-3. Configuration of Entropy Decoding Unit
2-4. Operation of Entropy Decoding Unit
3. Case of Performing Coding and Decoding by Computer 1. First Embodiment 1-1. Configuration of Image Coding Apparatus FIG. 1 illustrates a schematic configuration of an image coding apparatus according to an embodiment of the present invention. An image coding apparatus 10 is provided with a color conversion unit 11, an orthogonal transform unit 12, a quantization unit 13, a coefficient bit modeling unit 14, an entropy coding unit 15, a post-quantization unit 16, and a header creation unit 17.

The color conversion unit 11 performs a color conversion on image data input in an arbitrary color space (for example, RGB, YUV, or the like) into a particular color space and outputs image data after the color conversion to the orthogonal transform unit 12. This color conversion is a processing for enhancing a coding efficiency and is not a processing regularly performed in an image coding.

The orthogonal transform unit 12 performs a frequency transform for transforming respective pixel values from space coordinates into frequency coordinates on the image data supplied from the color conversion unit 11 (for example, an orthogonal transform such as discrete cosine transform (DCT), discrete Fourier transform (DFT), and wavelet transform (DWT)). The orthogonal transform unit 12 outputs coefficient data obtained through the orthogonal transform to the quantization unit 13.

The quantization unit 13 quantizes the coefficient data supplied from the orthogonal transform unit 12 to be output to the coefficient bit modeling unit 14. This quantization is not a processing regularly performed in the image coding.

The coefficient bit modeling unit 14 performs a processing for transforming the quantized coefficient data from the quantization unit so as to be efficiently coded by the entropy coding unit 15. The coefficient bit modeling unit 14 divides, for example, the coefficient data into code blocks and outputs the bit planes at the respective bit depths to the code blocks the entropy coding unit 15 from an MSB (Most Significant Bit) side towards an LSB (Least Significant Bit) side. FIGS. 2A and 2B are explanatory diagrams for describing a coefficient bit modeling in one dimension. As the coefficient data, for example, as illustrated in FIG. 2A, it is supposed that "10, 20, 5, 9, 34, 18, 2, 0" is input. In this case, when a size of the code block is set as 4×1, as illustrated in FIG. 2B, "10, 20, 5, 9" is a code block 0, and "34, 18, 2, 0" is a code block 1. The coefficient bit modeling unit 14 outputs a coefficient bit "0000" for the bit plane at the bit depth 0 in the code block 0 to the entropy coding unit 15. Next, the coefficient bit modeling unit 14 outputs a coefficient bit "0000" for the bit plane at the bit depth 1 in the code block 0 to the entropy coding unit 15. In a similar manner, the coefficient bit modeling unit 14 sequentially outputs coefficient bits "0000" to "0011" for the bit planes at the bit depth 2 to the bit depth 7 in the code block 0 to the entropy coding unit 15 for each bit depth. Also, with respect to the code block 1 too, similarly as in the code block 0, from the MSB side to the LSB side, the coefficient bit modeling unit 14 outputs the bit planes at the respective bit depths to the entropy coding unit 15. Also, the coefficient bit modeling unit 14 outputs the coefficient bit for the bit plane so as to enable identification of the bit depth. For example, bit depth information indicating the bit depth is output together with the coefficient bit for the bit plane.

In the entropy coding unit 15, attention is paid to a bias of the coefficient data obtained by the orthogonal transform unit 12, the variable-length coding or the fixed-length coding is adaptively selected in accordance with a state of the input coefficient data to code the coefficient data. The entropy coding unit 15 outputs the coded data obtained by performing the coding while adaptively selecting the variable-length coding or the fixed-length coding to the post-quantization unit 16.

The post-quantization unit 16 performs a bit truncation processing called truncation so that the coded data obtained by the entropy coding unit 15 has the desired data amount. The post-quantization unit 16 outputs the coded data after the post-quantization to the header creation unit 17.

The header creation unit 17 generates, for example, header information indicating a bit truncation position or the like to be added to the coded data where the post-quantization is performed and generates stream data to be output.

1-2. Configuration of Entropy Coding Unit

Next, the entropy coding unit 15 will be described. In a natural image, the sizes of the respective pieces of coefficient data in the code block have variation. At this time, scanning is performed on the respective pieces of coefficient data from the MSB side towards the LSB side, and the bit depth where the bit "1" exists for the first time varies. Also, for the coefficient bit in the vicinity of the bit depth where the bit becomes the bit "1" for the first time in the code block, "0" is likely to occur, and a bias is generated in occurrence probabilities of the coefficient bits. It should be noted that in the following description, in the respective pieces of coefficient data, the bit "1" appearing for the first time when the scanning is performed from the MSB side towards the LSB side is referred to as significant bit.

On the other hand, in the coefficient data where the significant bit is detected in the higher-order bit plane, as being closer to the LSB side, the probabilities where "1" and "0" occur become uniform to each other, and therefore the occurrence probabilities for "0" and "1" of the coefficient bits in the code block at the bit depth in the vicinity of the LSB are close to uniform to each other. In other words, when the number of pieces of significant data where the significant bit is detected in the higher-order bit plane in the coding target block is small, the occurrence probability for "0" is large, and when the number of pieces of significant data is large, the occurrence probabilities for "0" and "1" are equal to each other.

At this time, in a case where the amplitude of the significant data in the code block is small and the coding is performed from the position in the vicinity of the LSB, the number of bit depths with the uniform distribution on the LSB side is small, and therefore the bias of the probabilities where "0" and "1" occur in the coefficient bits becomes smaller as compared with the coefficient data where the number of pieces of coefficient data where the significant bit is detected in the higher-order bit plane is the same and the amplitude is large. FIG. 3 exemplifies a size of coefficient data, and for example, in the natural image, as illustrated in FIG. 3, in particular, the sizes of the coefficient data in the low pass and the high pass vary. It should be noted that in FIG. 3, "4L" is on the low pass, and "1H" is on the high pass.

In view of the above, the entropy coding unit 15 performs the variable-length coding from the bit plane on the MSB side in the respective code blocks and switches from the variable-length coding to the fixed-length coding on the basis of a comparison result between the bit depth and/or the number of pieces of coefficient data where the significant bit is detected on the higher-order bit plane and a threshold.

Figure 4:
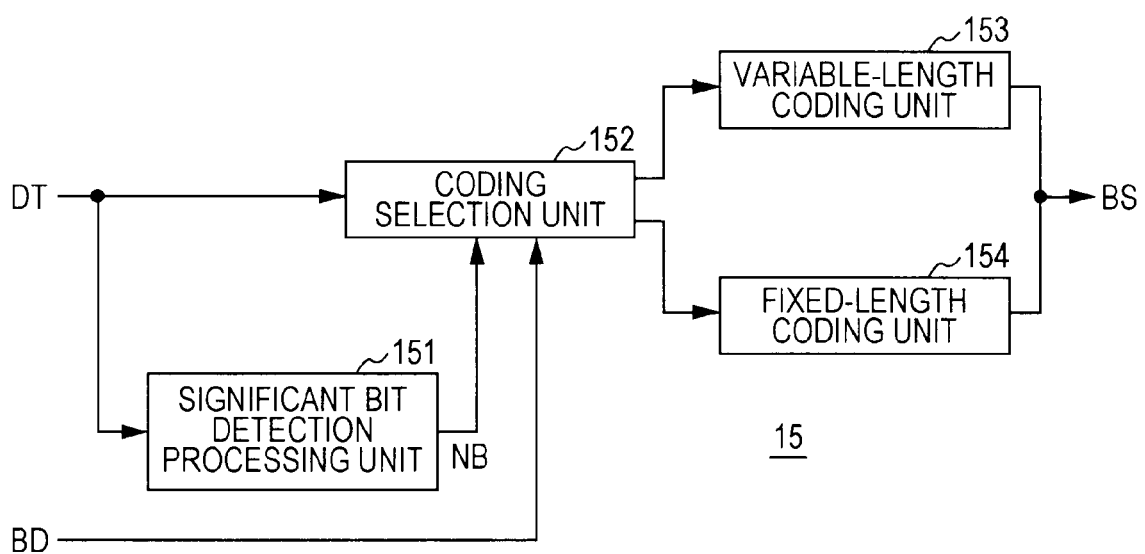
FIG. 4 illustrates a configuration of an entropy coding unit.

FIG. 4 illustrates a configuration of the entropy coding unit. The entropy coding unit 15 has a significant bit detection processing unit 151, a coding selection unit 152, a variable-length coding unit 153, and a fixed-length coding unit 154.

By using the coefficient bit DT for the bit plane output from the coefficient bit modeling unit 14, the significant bit detection processing unit 151 calculates a number of pieces of coefficient data NB where the significant bit is detected on the higher-order bit plane for each bit plane to be output to the coding selection unit 152. It should be noted that in the following description, the number of pieces of coefficient data where the significant bit is detected on the higher-order bit plane is referred to as number of pieces of significant data.

On the basis of the number of pieces of significant data NB and information indicating a bit depth BD which is output from the coefficient bit modeling unit 14, for each bit depth of the code block, the coding selection unit 152 determines whether the bit plane is coded by either the variable-length coding or the fixed-length coding. The coding selection unit 152 outputs the coefficient bit for the bit plane where it is determined that the variable-length coding is performed to the variable-length coding unit 153. Also, the coding selection unit 152 outputs the coefficient bit for the bit plane where it is determined that the fixed-length coding to the fixed-length coding unit 154.

The variable-length coding unit 153 performs the variable-length coding on the bit plane selected by the coding selection unit 152 and outputs obtained coded data BS to the post-quantization unit 16 illustrated in FIG. 1. Also, the fixed-length coding unit 154 performs the fixed-length coding on the bit plane selected by the coding selection unit 152 and outputs the obtained coded data BS to the post-quantization unit 16 illustrated in FIG. 1. Also, the variable-length coding unit 153 uses a coding table previously created on the basis of the occurrence probability of the coefficient bit, for example, a coding table previously optimized to the coefficient bits with the large bias to perform the variable-length coding.

1-3. Operation of Entropy Coding Unit

Figure 5:
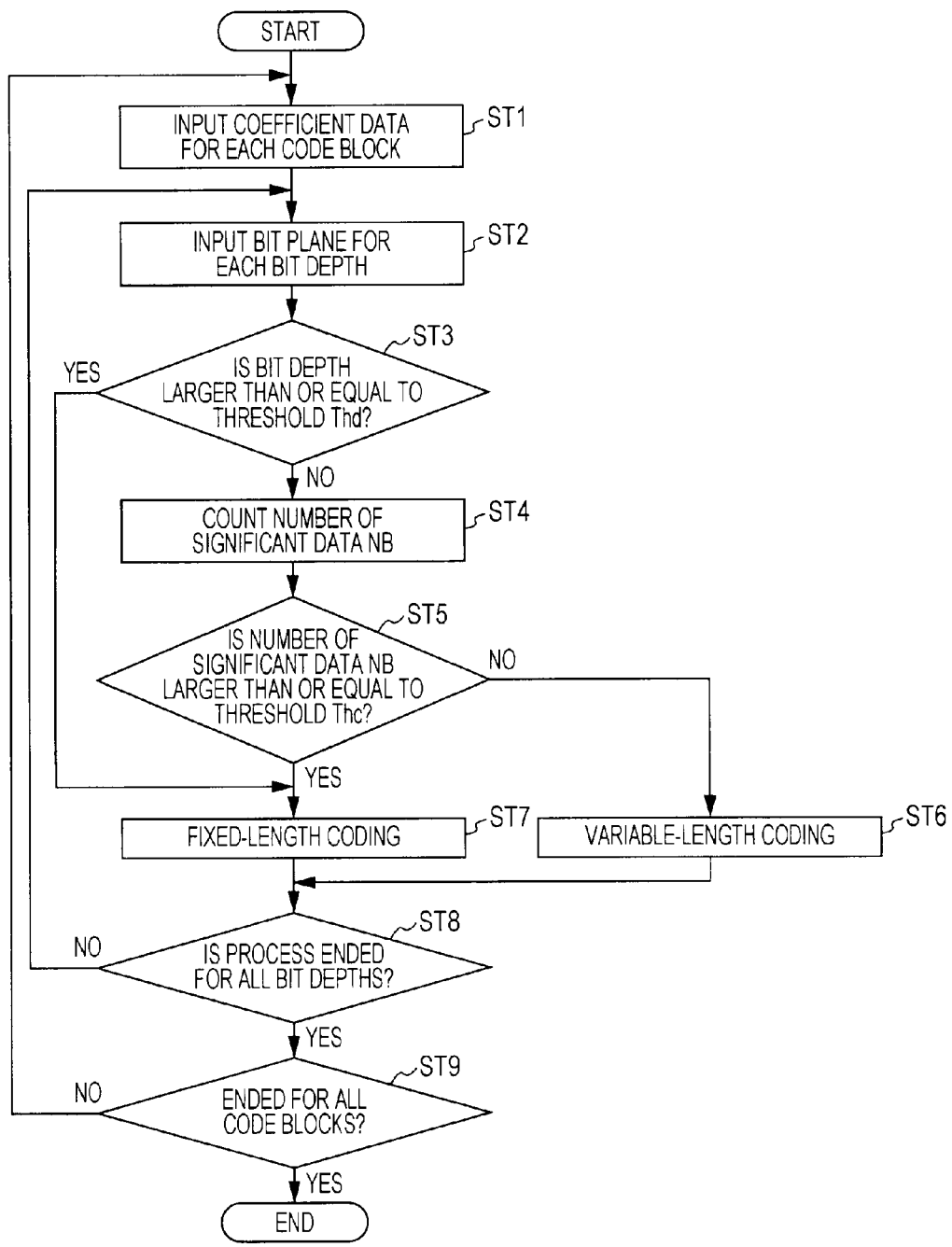
FIG. 5 is a flow chart for describing an operation of the entropy coding unit.

Next, an operation of the entropy coding unit 15 will be described. FIG. 5 is a flow chart for describing an operation of the entropy coding unit. It should be noted that FIG. 5 illustrates a case in which the bit depth BD becomes larger than or equal to a threshold Thd or the number of pieces of significant data NB becomes larger than or equal to a threshold Thc, the coding is performed while switching from the variable-length coding to the fixed-length coding. Also, in a decoding which will be described below, to make it possible to correctly switch from the variable-length coding to the fixed-length coding, when the number of pieces of significant data NB becomes larger than or equal to the threshold Thc on the bit plane by one higher order, the switching from the variable-length coding to the fixed-length coding is performed.

In step ST1, the entropy coding unit 15 inputs the coefficient data for each code block, and the processing proceeds to step ST2.

In step ST2, the entropy coding unit 15 inputs the bit plane for each bit depth, and the processing progresses to step ST3. The entropy coding unit 15 inputs the coefficient bit of the bit plane with the input coding target code block for each bit depth from the MSB side towards the LSB side.

In step ST3, the entropy coding unit 15 determines whether or not the bit depth BD is larger than or equal to the previously set threshold Thd. When the bit depth BD is smaller than the threshold Thd, the entropy coding unit 15 proceeds to step ST4, and when the bit depth BD is larger than or equal to the threshold Thd, the entropy coding unit 15 proceeds to step ST7.

In step ST4, the entropy coding unit 15 counts the number of pieces of significant data NB and proceeds to step ST5. The entropy coding unit 15 counts the number of pieces of significant data NB on the bit plane by one higher-order than the coding target bit plane.

In step ST5, the entropy coding unit 15 determines whether the number of pieces of significant data NB is larger than or equal to the previously set threshold Thc. When the number of pieces of significant data NB is smaller than the threshold Thc, the entropy coding unit 15 proceeds to step ST6, and when the number of pieces of significant data NB is larger than or equal to the threshold Thc, the entropy coding unit 15 proceeds to step ST7.

In step ST6, the entropy coding unit 15 performs the variable-length coding. The entropy coding unit 15 performs the variable-length coding on the coding target bit plane and proceeds to step ST8.

In step ST7, the entropy coding unit 15 performs the fixed-length coding. The entropy coding unit 15 performs the fixed-length coding on the coding target bit plane and proceeds to step ST8.

In step ST8, the entropy coding unit 15 determines whether the processing is ended for all the bit depths. When the bit plane at the bit depth where the processing is not performed remains, the entropy coding unit 15 returns to step ST2 and performs the processing by inputting the bit plane at the new bit depth. On the other hand, when the bit plane at the bit depth where the processing is not performed does not remain, the entropy coding unit 15 proceeds to step ST9.

In step ST9, the entropy coding unit 15 determines whether the processing is ended for all the code blocks. When the code block where the processing is not performed remains, the entropy coding unit 15 returns to step ST1 and performs the processing by inputting the coefficient data of the new code block. On the other hand, when the code block where the processing is not performed does not remain, the entropy coding unit 15 ends the entropy coding processing.

It should be noted that as the number of pieces of significant data NB does not decreases when the bit depth deepens, in a case where the number of pieces of significant data NB becomes larger than or equal to the threshold Thc, it is also possible to end the processing of one code block while setting all the subsequent bit planes to the next deep bit depth for the fixed-length coding.

Next, by using FIGS. 6A and 6B, a specific example of the operation of the entropy coding unit 15 will be described. It should be noted that the size of the code block is set as "4×1", the threshold Thd is set as "7", and the threshold Thc is set as "3".

Figure 6A:
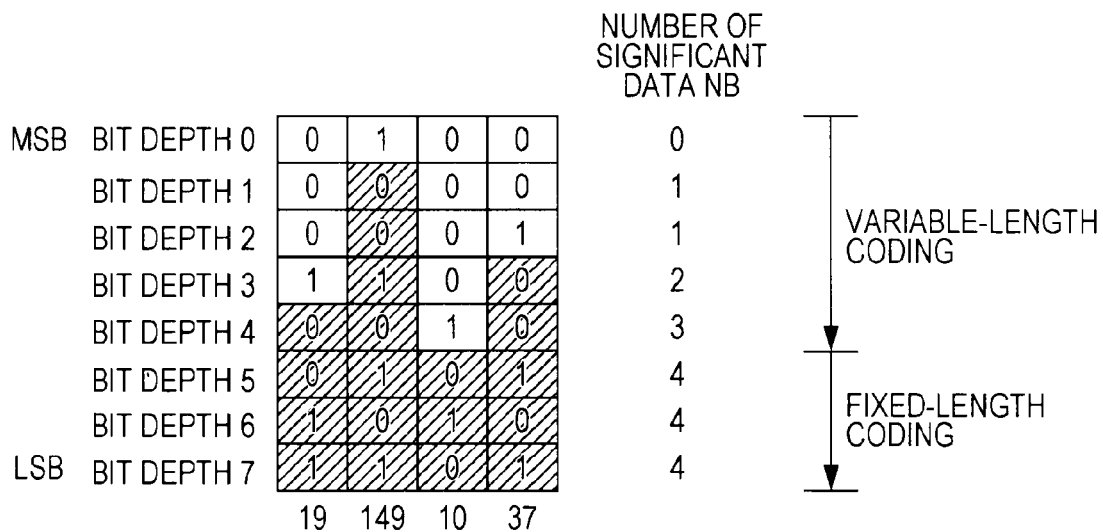
FIGS. 6A and 6B are explanatory diagrams for describing a specific example of the operation in the entropy coding unit.

The coefficient data of one code block is set, for example, as "19, 149, 10, 37" based on a decimal numeral representation as illustrated in FIG. 6A. In this case, the entropy coding unit 15 is supplied from the coefficient bit modeling unit 14 with the coefficient bits for the respective bit planes from the MSB side towards the LSB side of the code block. It should be noted that in FIG. 6A, the significant bit is indicated by diagonal lines.

The entropy coding unit 15 inputs the coefficient bit for each bit plane through the processing in step ST1 and step ST2. Also, through the processing in step ST3, when the bit plane of the input coefficient bit is the bit depth 0 to the bit depth 6, the entropy coding unit 15 performs the processing from step ST4. Furthermore, the entropy coding unit 15 performs the processing in step ST7 when the bit plane of the input coefficient bit is larger than or equal to the bit depth 7.

When the bit plane at the bit depth 0 is input, as the number of pieces of significant data NB is "0" because the bit plane by one higher-order does not exist, in step ST6, the entropy coding unit 15 performs the variable-length coding for the bit plane at the bit depth 0. Also, through the processing in step ST8 and step ST2, the coefficient bit for the bit plane at the bit depth 1 is input, and the processing from step ST3 is performed. Also, while repeatedly performing a similar processing, the entropy coding unit 15 performs the variable-length coding for the bit planes up to the bit depth 4 where it is determined that the number of pieces of significant data NB on the bit plane by one higher-order is smaller than the threshold Thc and performs the fixed-length coding from the bit depth 6 that is the bit plane where it is determined that the number of pieces of significant data NB on the bit plane by one higher-order is larger than or equal to the threshold Thc. In this manner, the coding on one code block is performed.

Figure 6B:
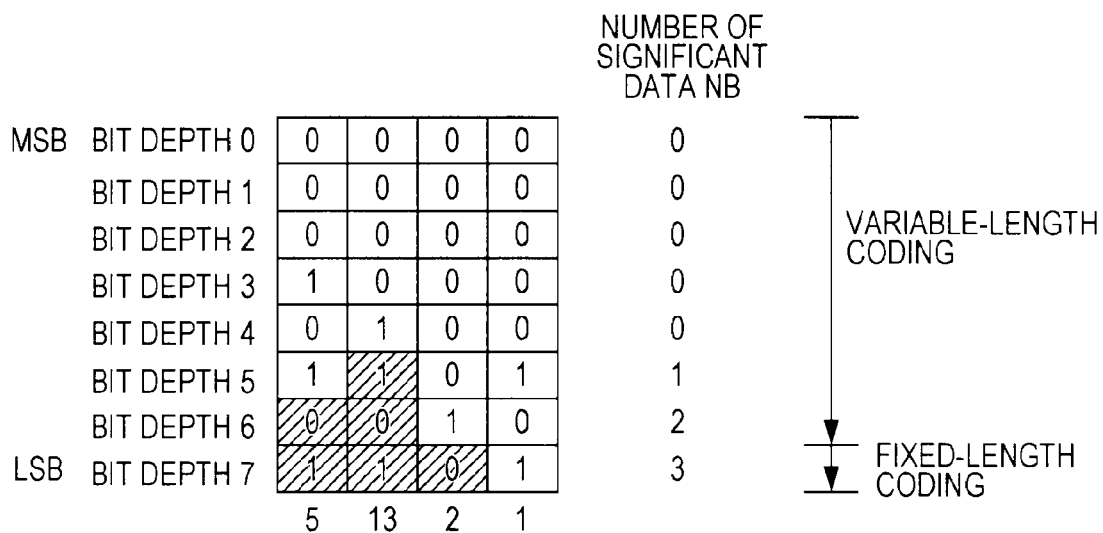

As illustrated in FIG. 6B, the coefficient data of the next code block is set, for example, as "5, 13, 2, 1" based on a decimal numeral representation. In this case, the entropy coding unit 15 is supplied with the bit planes at the respective depths from the coefficient bit modeling unit 14 from the MSB side towards the LSB side of the code block. It should be noted that also in FIG. 6B, the significant bit is indicated by diagonal lines.

The entropy coding unit 15 inputs the coefficient bit for each bit plane through the processing in step ST1 and step ST2. Also, through the processing in step ST3, when the input bit plane is at the bit depth 0 to the bit depth 6, the entropy coding unit 15 performs the processing from step ST4, and when the input bit plane is at the bit depth 7, the entropy coding unit 15 performs the processing in step ST7.

When the input bit plane is at the bit depth 0, as the number of pieces of significant data NB is "0" because the bit plane by one higher-order does not exist, the entropy coding unit 15 performs the variable-length coding for the bit plane at the bit depth 0 in step ST6. Also, through the processing in step ST8 and step ST2, the coefficient bit for the bit plane at the bit depth 1 is input, and the processing from step ST3 is performed. Also, while repeatedly performing a similar processing, as the number of pieces of significant data NB on the bit plane by one higher-order is not larger than or equal to the threshold Thc up to the bit depth 6, the entropy coding unit 15 performs the variable-length coding for the bit planes up to the bit depth 6. Also, when the bit depth becomes the bit depth 7, the bit depth is larger than or equal to the threshold Thd, the entropy coding unit 15 performs the fixed-length coding. In this manner, the coding on the next code block is performed.

FIGS. 7A and 7B exemplify coding tables, where FIG. 7A illustrates a coding table previously created on the basis of the occurrence probability of the coefficient bit, for example, a coding table optimized to the coefficient bits with the large bias. FIG. 7A illustrates a case, for example, in which the bias of the coefficient bits is generated where the number of bit planes with the smaller number of pieces of significant data as compared with the bit plane with the large number of pieces of significant data increases. In this case, the coding table is optimized by reducing the bits allocated to the bit plane with the small number of pieces of significant data to increase the bits allocated to the bit planes with the large number of pieces of significant data. It should be noted that FIG. 7B illustrates a coding table in related art where the optimization is not carried out in accordance with the bias.

When the coding is performed as described above on the code block illustrated in FIG. 6A and the coding table illustrated in FIG. 7A is used in the variable-length coding, the coding length from the bit depth 0 to the bit depth 4 is "3, 2, 3, 4, 4". Also, when the code length in the fixed-length coding is set as "4", the respective code lengths at the bit depths 5, 6, and 7 are "4", and the code length of the entire code block is 28 bits. It should be noted that in a case where the coding table illustrated in FIG. 7B is used, the coding length from the bit depth 0 to the bit depth 4 is "4, 3, 4, 4, 4". Also, when the code length in the fixed-length coding is set as "4", the respective code lengths at the bit depths 5, 6, and 7 are "4", and the code length of the entire code block is 31 bits. Therefore, by using the coding table optimized to the coefficient bits with the large bias, it is possible to enhance the coding efficiency.

Also, with respect to the code block illustrated in FIG. 6B, while the coding is performed as described above, when the coding table illustrated in FIG. 7A is used in the variable-length coding, the coding length from the bit depth 4 to the bit depth 6 is "3, 4, 4". Also, when the code length in the fixed-length coding is set as "4", the code length at the bit depth 7 is "4". Also, the bit depth 0 to the bit depth 3 are zero-bit planes which are skipped at the time of the coding, and the code length of the entire code block is 15 bits. It should be noted that in a case where the coding table illustrated in FIG. 7B is used, the coding length from the bit depth 4 to the bit depth 6 is "4, 4, 4", and the code length of the entire code block is 16 bits. Therefore, by using the coding table optimized to the coefficient bits with the large bias, it is possible to enhance the coding efficiency.

It should be noted that in the above-mentioned description, when the bit depth becomes larger than or equal to the threshold Thd or when the number of pieces of significant data NB on the bit plane by one higher-order becomes larger than or equal to the threshold Thc, the switching from the variable-length coding to the fixed-length coding is carried out. However, although not illustrated in the drawing, when the bit depth becomes larger than or equal to the threshold Thd and the number of pieces of significant data NB becomes larger than or equal to the threshold Thc, the entropy coding unit 15 may carry out the coding while switching from the variable-length coding to the fixed-length coding. That is, the coding selection unit 152 selects the fixed-length coding on the bit plane where the bit depth is larger than or equal to the threshold Thd and/or the number of pieces of significant data NB on the bit plane by one higher-order is larger than or equal to the threshold Thc and selects the variable-length coding on the other bit plane.

Figure 8:
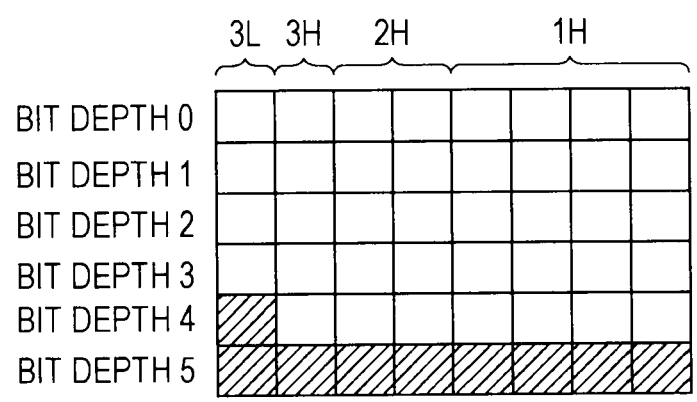
FIG. 8 illustrates a case in which a threshold is set for each frequency band.

Furthermore, the threshold Thd may be set for each frequency band. FIG. 8 illustrates a case in which a threshold is set for each frequency band. For example, FIG. 8 illustrates a case in which with respect to a sub band 3L, the threshold Thd is set as the bit depth 4, and with respect to sub bands 3H, 2H, and 1H, the threshold Thd is set as the bit depth 5, and a diagonal line part indicates a bit plane where the fixed-length coding is performed. When the threshold Thd is set for each frequency band, it is possible to further enhance the coding efficiency. For example, in a case where the number of bit planes with the large number of pieces of significant data decreases when the frequency is increased, if the threshold Thd in accordance with the sub band with a low frequency is set, in the sub band with a high frequency, the bit plane where the number of bits that can be reduced through the variable-length coding is subjected to the fixed-length coding. When the threshold Thd is set for each frequency band, in the sub band with the high frequency, by setting the threshold Thd at a position at a deep bit depth, performance of the fixed-length coding on the bit plane with the small number of pieces of significant data is prevented, and it is possible to enhance the coding efficiency.

As described above, as the entropy coding unit 15 selects the variable-length coding or the fixed-length coding in accordance with the bit depth of the coefficient data and the number of pieces of significant data, it is possible to improve the coding efficiency. Also, by optimizing the coding table used in the variable-length coding to the coefficient bits with the large bias, it is possible to further improve the coding efficiency.

1-4. Configuration of Image Decoding Apparatus

Figure 9:
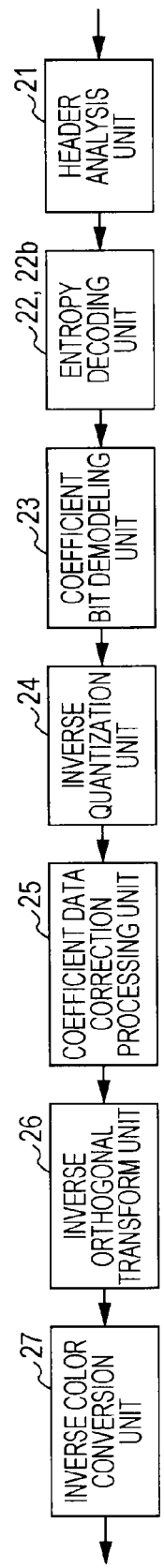
FIG. 9 illustrates a schematic configuration of an image decoding apparatus according to an embodiment.

Next, an image decoding apparatus will be described. FIG. 9 illustrates a schematic configuration of an image decoding apparatus according to an embodiment of the present invention. An image decoding apparatus 20 is provided with a header analysis unit 21, an entropy decoding unit 22, a coefficient bit demodeling unit 23, an inverse quantization unit 24, a coefficient data correction processing unit 25, an inverse orthogonal transform unit 26, and an inverse color conversion unit 27.

The header analysis unit 21 reads header information from stream data output by the image coding apparatus (for example, a bit truncation position or the like) for analysis. The header analysis unit 21 outputs an analysis result to the entropy decoding unit 22 or the coefficient data correction processing unit 25. Also, the header analysis unit 21 outputs coded data in stream data to the entropy decoding unit 22.

The entropy decoding unit 22 uses the analysis result on the header information to perform decoding on the coded data while corresponding to the coding performed by the entropy coding unit 15. The entropy decoding unit 22 outputs the bit plane obtained by performing the decoding on the coded data to the coefficient bit demodeling unit 23.

The coefficient bit demodeling unit 23 performs an inverse processing to the processing performed by the coefficient bit modeling unit 14. That is, the coefficient bit demodeling unit 23 makes a hierarchy of the coefficient bits for the bit planes output from the entropy decoding unit 22 to generate coefficient data for each code block. The coefficient bit demodeling unit 23 outputs the generated coefficient data of the code blocks to the inverse quantization unit 24.

The inverse quantization unit 24 performs an inverse quantization through a predetermined calculation expression corresponding to the quantization unit 13 on the coefficient data output from the coefficient bit demodeling unit 23 and generates inversely quantized coefficient data to be output to the coefficient data correction processing unit 25.

The coefficient data correction processing unit 25 performs the determination on the truncated bit on the basis of an analysis result on the header information and corrects the coefficient data by inserting new data at the truncated bit position. Also, the coefficient data correction processing unit 25 performs a correction with regard to the truncated bit through the quantization. The coefficient data correction processing unit 25 outputs the coefficient data after the correction to the inverse orthogonal transform unit 26.

The inverse orthogonal transform unit 26 performs an inverse transform corresponding to the orthogonal transform unit 12 of the image coding apparatus on the coefficient data that is output from the coefficient data correction processing unit 25 to create image data.

The inverse color conversion unit 27 performs a predetermined inverse color conversion corresponding to the color conversion unit 11 of the image coding apparatus on the image data obtained by the inverse orthogonal transform unit 26 and generates output image data to be output.

1-5. Configuration of Entropy Decoding Unit

Figure 10:
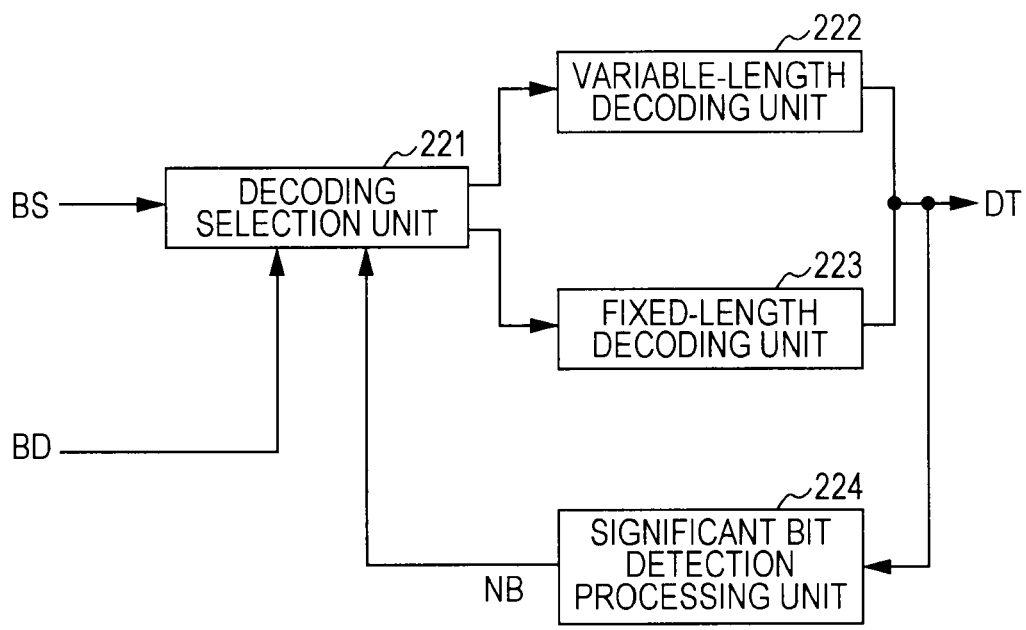
FIG. 10 illustrates a configuration of an entropy decoding unit.

FIG. 10 illustrates a configuration of the entropy decoding unit 22. The entropy decoding unit 22 is provided with a decoding selection unit 221, a variable-length decoding unit 222, a fixed-length decoding unit 223, and a significant bit detection processing unit 224.

The decoding selection unit 221 selects either the variable-length decoding unit 222 or the fixed-length decoding unit 223 and outputs the input coded data BS to the selected decoding unit. The decoding selection unit 221 performs a selection processing corresponding to the coding selection unit 152 of the entropy coding unit 15 and selects the variable-length decoding or the fixed-length decoding on the basis of a comparison result between a bit depth and a threshold Th and/or a comparison result between the number of pieces of significant data NB on the bit plane by one higher-order and the threshold Thc. It should be noted that the threshold may be previously decided by the entropy coding unit and the entropy decoding unit, and the header information may also include the threshold used in the entropy coding unit.

The variable-length decoding unit 222 outputs the coefficient bit DT for the bit plane obtained by performing the variable-length decoding on the coded data BS to the significant bit detection processing unit 224 and the coefficient bit demodeling unit 23 illustrated in FIG. 9. Also, the fixed-length decoding unit 223 outputs the coefficient bit DT for the bit plane obtained by performing the fixed-length decoding on the coded data BS to the coefficient bit demodeling unit 23 illustrated in FIG. 9.

The significant bit detection processing unit 224 detects the number of pieces of significant data NB from the decoded bit plane and outputs the number of pieces of significant data NB to the decoding selection unit 221. For example, it is supposed that the coding is performed from the MSB side, and on the basis of the comparison result between the bit depth BD and/or the number of pieces of significant data NB and the threshold Thc, the switching from the variable-length decoding to the fixed-length decoding is performed. In this case, the significant bit detection processing unit 224 detects the number of pieces of significant data NB from the bit plane decoded by the variable-length decoding unit 222.

1-6. Operation of Entropy Decoding Unit

Figure 11:
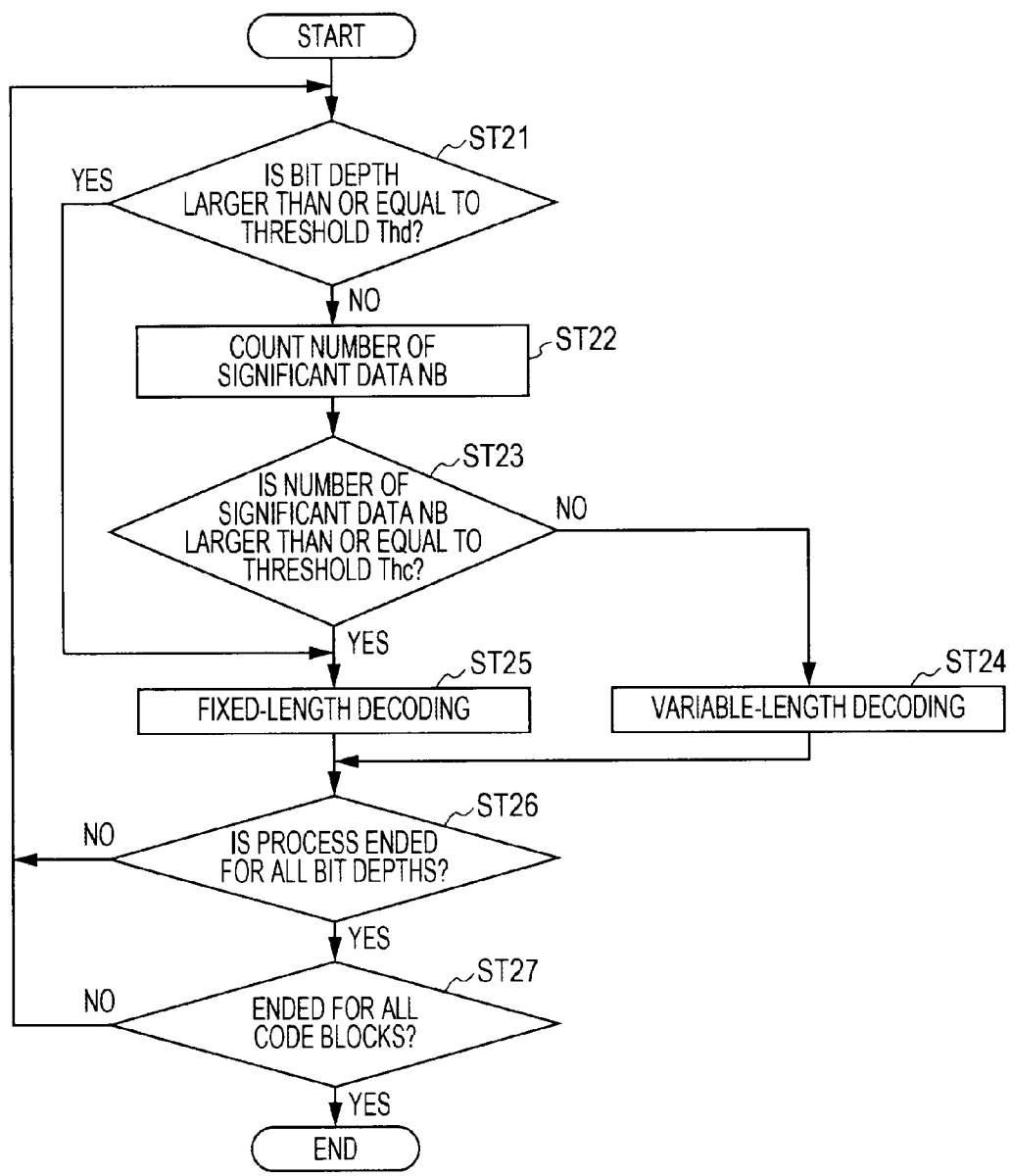
FIG. 11 is a flow chart for describing an operation of the entropy decoding unit.

FIG. 11 is a flow chart for describing an operation of the entropy decoding unit. It should be noted that FIG. 11 illustrates a case in which a decoding is performed while switching from the variable-length decoding to the fixed-length decoding when the bit depth BD is larger than or equal to the threshold Thd or when the number of pieces of significant data NB on the bit plane by one higher-order is larger than or equal to the threshold Thc. It should be noted that the entropy decoding unit performs the switching from the variable-length decoding to the fixed-length decoding when the number of pieces of significant data NB on the bit plane by one higher-order is larger than or equal to the threshold Thc.

In step ST21, the entropy decoding unit 22 determines whether or not the bit depth is larger than or equal to the threshold Thd. The entropy decoding unit 22 proceeds to step ST22 when the bit depth BD of the coded data subjected to the decoding is smaller than the threshold Thd, and the entropy decoding unit 22 proceeds to step ST25 when the bit depth is larger than or equal to the threshold Thd.

In step ST22, the entropy decoding unit 22 counts the number of pieces of significant data NB. The entropy decoding unit 22 counts the number of pieces of significant data NB on the decoded bit plane which is higher order by one than the bit plane to be generated by performing the decoding and proceeds to step ST23.

In step ST23, the entropy decoding unit 22 determines whether or not the number of pieces of significant data NB becomes larger than or equal to the threshold Thc. The entropy decoding unit 22 proceeds to step ST24 when the number of pieces of significant data NB is smaller than the threshold Thc, and the entropy decoding unit 22 proceeds to step ST25 when the number of pieces of significant data NB is larger than or equal to the threshold Thc.

In step ST24, the entropy decoding unit 22 performs the variable-length decoding. The entropy decoding unit 22 uses the variable-length decoding table corresponding to the variable-length coding table used in the entropy coding unit 15, in this instance, the decoding table previously created on the basis of the occurrence probabilities of the coefficient bits, performs the variable-length decoding on the coded data BS, generates the bit plane, and proceeds to step ST26.

In step ST25, the entropy decoding unit 22 performs the fixed-length decoding. The entropy decoding unit 22 uses the fixed-length decoding table corresponding to the fixed-length coding table used in the entropy coding unit 15, performs the fixed-length decoding on the coded data BS, generates the bit plane, and proceeds to step ST26.

In step ST26, the entropy decoding unit 22 determines whether or not the processing is ended for all the bit depths. When the bit plane at the bit depth where the decoding is not performed remains, the entropy decoding unit 22 returns to step ST21 and continues the decoding processing. Also, when the bit planes at the respective bit depths of the code block are obtained, the entropy decoding unit 22 proceeds to step ST27.

In step ST27, the entropy decoding unit 22 determines whether the processing is ended for all the code blocks. When the coded data where the decoding is not performed remains, the entropy decoding unit 22 returns to step ST21 and obtains the bit planes at the respective bit depths of the new code block by performing the decoding. On the other hand, the entropy decoding unit 22 ends the entropy decoding processing when the coded data where the processing is not performed does not remain.

It should be noted that as the number of pieces of significant data NB does not decreases when the bit depth deepens, if the number of pieces of significant data NB becomes larger than or equal to the threshold Thc, it is also possible to perform the decoding of one code block while all setting the fixed-length decoding.

Figure 12:
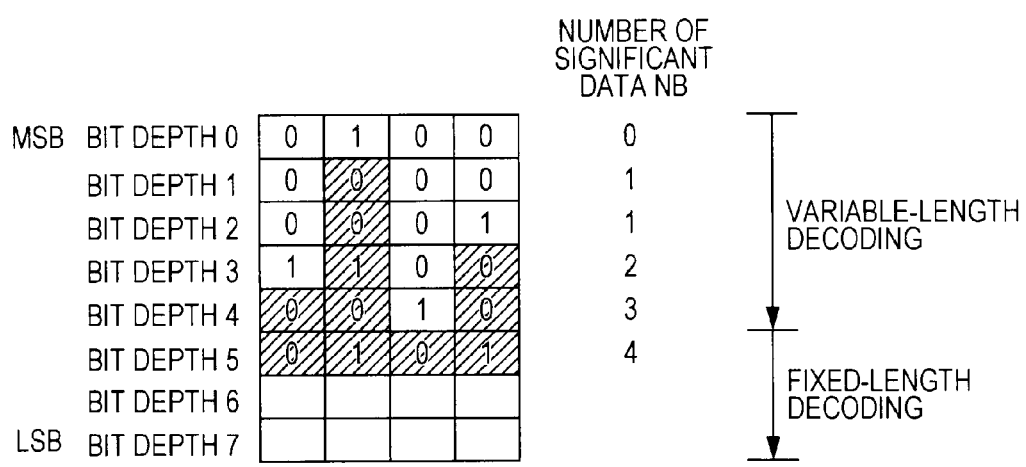
FIG. 12 is an explanatory diagram for describing a specific example of the operation in the entropy decoding unit.

When the above-mentioned decoding is performed, for example, in a case where the coded data of the code block illustrated in FIG. 6A is decoded, as illustrated in FIG. 12, the variable-length decoding is performed from the bit depth 0. After that, when the number of pieces of significant data NB on the bit plane by one higher-order at the bit depth 5 is larger than or equal to the threshold Thc "3", the switching is performed from the variable-length decoding to the fixed-length decoding, and it is possible to correctly obtain the bit planes at the bit depths 5, 6, and 7. Also, for example, in a case where the coded data of the code block illustrated in FIG. 6B is decoded, the variable-length decoding is performed up to the bit depth 6, and at the bit depth 7, as the bit depth is the threshold Thd, the fixed-length decoding is performed. Therefore, the coded data can be correctly decoded.

It should be noted that in the above-mentioned description, while corresponding to the coding, when the bit depth becomes larger than or equal to the threshold Thd or when the number of pieces of significant data NB on the bit plane by one higher-order becomes larger than or equal to the threshold Thc, the switching from the variable-length decoding to the fixed-length decoding is performed. However, in the coding, in a case where the switching is performed from the variable-length coding to the fixed-length coding when the bit depth is larger than or equal to the threshold Thd and the number of pieces of significant data NB becomes larger than or equal to the threshold Thc, if the bit depth is larger than or equal to the threshold Thd and the number of pieces of significant data NB becomes larger than or equal to the threshold Thc, the switching may be performed from the variable-length decoding to the fixed-length decoding. That is, while corresponding to the coding selection unit 152, the decoding selection unit 221 selects the fixed-length decoding in a case where the bit depth is larger than or equal to the threshold Thd and/or the number of pieces of significant data NB on the bit plane by one higher-order is larger than or equal to the threshold Thc and selects the variable-length decoding for the other plane.

In this manner, according to the first embodiment, while taking into account the occurrence probabilities of "0" and "1" of the coefficient bits, on the basis of the bit depth and the number of pieces of significant data, the selection of the variable-length coding or the fixed-length coding is performed. Also, in the variable-length coding, the coding table is used which is optimized while taking into account the bias of the coefficient data. Therefore, it is possible to enhance the coding efficiency. In addition, as it is possible to enhance the coding efficiency, it is possible to further suppress the sense of discomfort, the sense of obscurity, or the like generated in the image which is caused by the post-quantization. Furthermore, in a case where the fixed-length coding is performed, a reference is not made to Huffman table, and the calculation amount is reduced as compared with the case of performing all the variable-length coding.

2. Second Embodiment

Incidentally, bit distributions of the coefficient data vary depending on a context (for example, one of a color component, frequency band information, or the like, or a combination thereof). Therefore, if the threshold for determining whether the variable-length coding or the fixed-length coding is selected in accordance with the context is optimized, it is possible to improve the coding efficiency. Also, if the variable-length coding table in accordance with the context is optimized, it is possible to further improve the coding efficiency. Next, as a second embodiment, a coding processing and a decoding processing using the context will be described.

2-1. Configuration of Entropy Coding Unit

Figure 13:
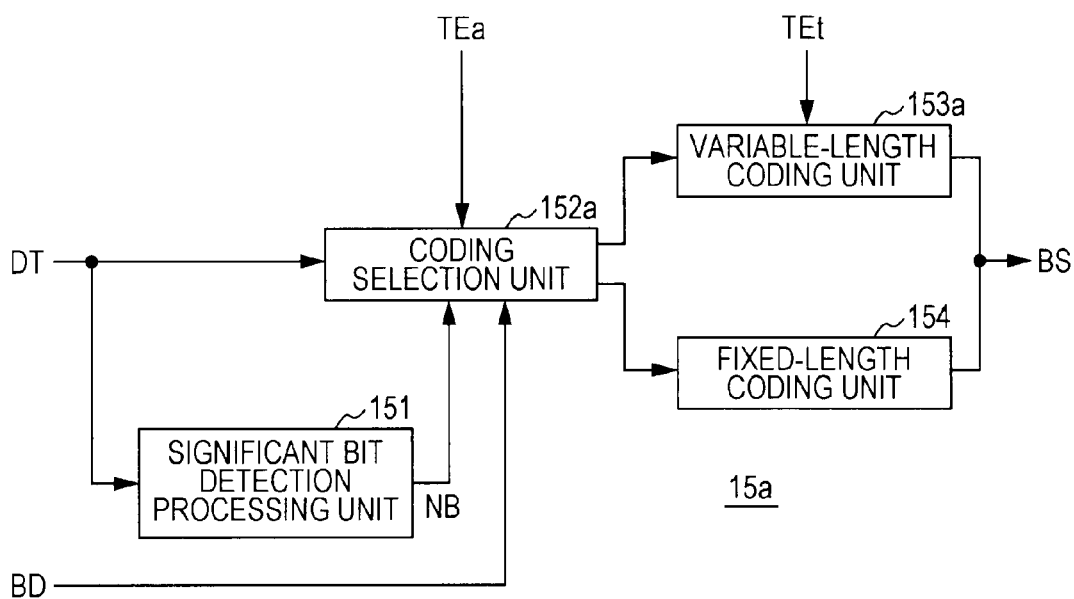
FIG. 13 illustrates a configuration of an entropy coding unit that optimizes a threshold in accordance with a context.

FIG. 13 illustrates a configuration of an entropy coding unit that optimizes a threshold in accordance with a context. An entropy coding unit 15a has the significant bit detection processing unit 151, a coding selection unit 152a, a variable-length coding unit 153a, and the fixed-length coding unit 154.

The significant bit detection processing unit 151 calculates the number of pieces of significant data NB existing on the MSB side from the bit depth of the coding target to be output to the coding selection unit 152a.

On the basis of the number of pieces of significant data NB and the bit depth BD of the coding target block, for each bit depth of the code block, the coding selection unit 152a determines whether the bit plane is coded through either the variable-length coding or the fixed-length coding. The coding selection unit 152a outputs the bit plane at the bit depth where it is determined that the variable-length coding is performed to the variable-length coding unit 153a. On the other hand, the coding selection unit 152a outputs the bit plane at the bit depth where it is determined that the fixed-length coding is performed to the fixed-length coding unit 154. Furthermore, the coding selection unit 152a performs the selection between the variable-length coding and the fixed-length coding by using the thresholds Thd and Thc optimized in accordance with a context Tea as the threshold Thd that is compared with the bit depth and the threshold Thc that is compared with the number of pieces of significant data NB.

The variable-length coding unit 153a performs the variable-length coding for the bit plane selected by the coding selection unit 152a and outputs the obtained coded data BS to the post-quantization unit 16 illustrated in FIG. 1. Furthermore, the variable-length coding unit 153a performs the variable-length coding by using not only the coefficient bits with the large bias but also the coding table optimized in accordance with a context TEb.

The fixed-length coding unit 154 performs the fixed-length coding for the bit plane selected by the coding selection unit 152a and outputs the obtained coded data BS to the post-quantization unit 16 illustrated in FIG. 1.

It should be noted that the context Tea and a context TEt may be equal to each other or different from each other. Furthermore, a configuration may also be adopted in which the coding selection unit 152a changes either the threshold Thd or The in accordance with the context TEa. Furthermore, a configuration may also be adopted in which the context is used by one of the coding selection unit 152a and the variable-length coding unit 153a. Also, the same also applies to an entropy decoding unit 22a which will be described below.

2-2. Operation of Entropy Coding Unit

Figure 14:
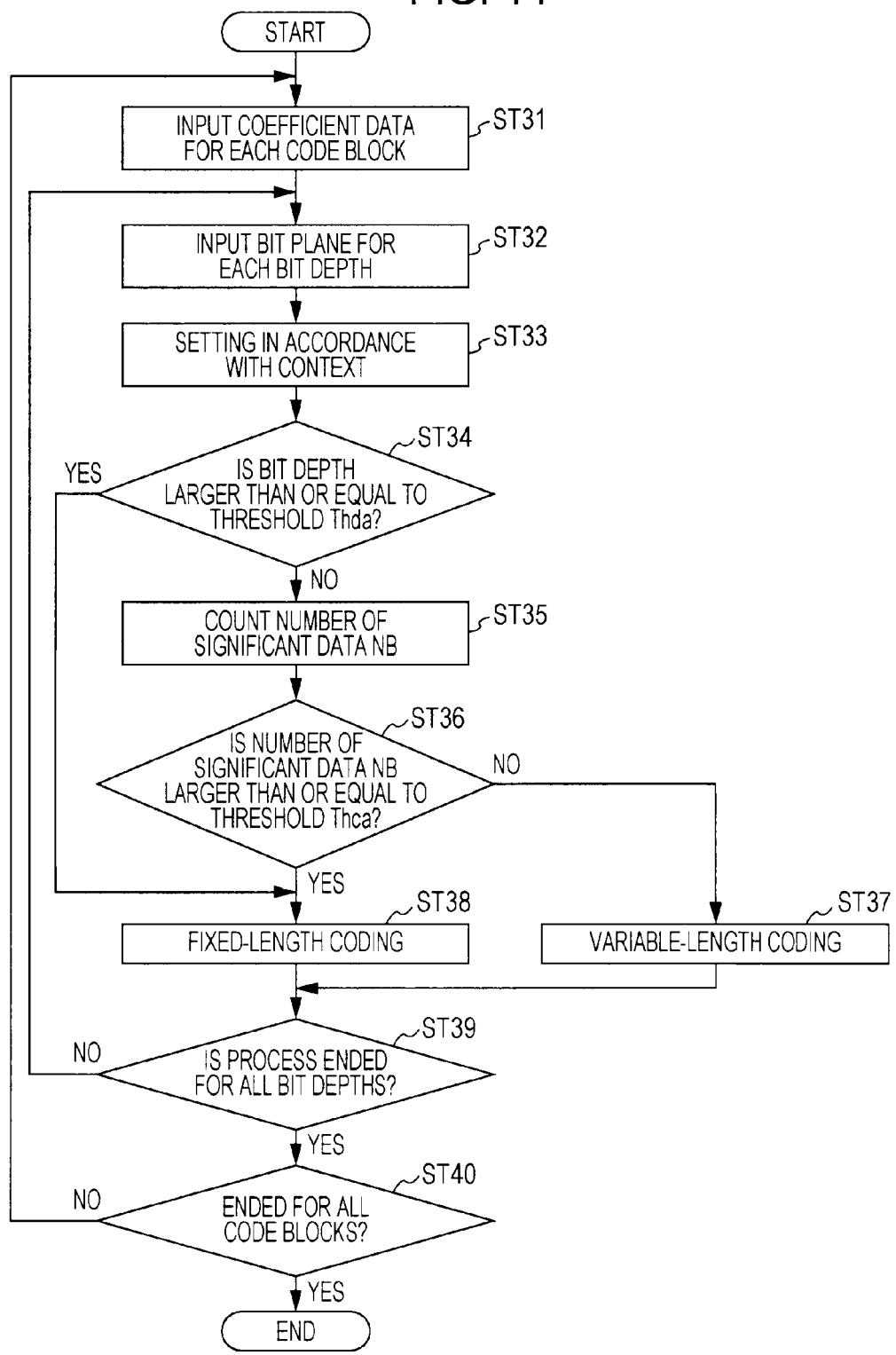
FIG. 14 is a flow chart for describing an operation of the entropy coding unit.

Next, an operation of the entropy coding unit 15a will be described. FIG. 14 is a flow chart for describing an operation of the entropy coding unit 15a. It should be noted that FIG. 14 illustrates a case in which the coding is performed while switching from the variable-length coding to the fixed-length coding when the bit depth becomes larger than or equal to a threshold Thda decided in accordance with the context or when the number of pieces of significant data on the bit plane by one higher-order becomes larger than or equal to a threshold Thca decided in accordance with the context. Also, in the decoding, to make it possible to correctly perform the switching from the variable-length coding to the fixed-length coding in units of the bit plane, the switching from the variable-length coding to the fixed-length coding is performed when the bit depth becomes larger than or equal to the threshold Thda. Also, when the number of pieces of significant data NB on the bit plane by one higher-order becomes larger than or equal to the threshold Thca, the switching from the variable-length coding to the fixed-length coding is performed.

In step ST31, the entropy coding unit 15a inputs the coefficient data for each code block, and the processing proceeds to step ST32.

In step ST32, the entropy coding unit 15a inputs the bit plane for each bit depth, and the processing progresses to step ST33. The entropy coding unit 15a inputs the bit plane with the input coding target code block for each bit depth from the MSB side towards the LSB side.

In step ST33, the entropy coding unit 15a performs a setting in accordance with the context. The entropy coding unit 15a sets the threshold Thda and Thca optimized in accordance with the context. Also, the entropy coding unit 15a performs a setting so as to use not only the coefficient bits with the large bias but also the coding table optimized in accordance with the context and proceeds to step ST34.

In step ST34, the entropy coding unit 15a determines whether or not the bit depth is larger than or equal to the threshold Thda. When the bit depth is smaller than the threshold Thda, the entropy coding unit 15a proceeds to step ST35, and when the bit depth is larger than or equal to the threshold Thda, the entropy coding unit 15a proceeds to step ST38.

In step ST35, the entropy coding unit 15a counts the number of pieces of significant data NB and proceeds to step ST36. The entropy coding unit 15 counts the number of pieces of significant data NB on the bit plane by one higher-order than the coding target bit plane.

In step ST36, the entropy coding unit 15a determines whether or not the number of pieces of significant data NB is larger than or equal to the threshold Thca. When the number of pieces of significant data NB is smaller than the threshold Thca, the entropy coding unit 15a proceeds to step ST37, and when the number of pieces of significant data NB is larger than or equal to the threshold Thca, the entropy coding unit 15a proceeds to step ST38.

In step ST37, the entropy coding unit 15a performs the variable-length coding. The entropy coding unit 15a performs the variable-length coding on the bit plane and proceeds to step ST39. Also, the entropy coding unit 15a uses not only the coefficient bits with the large bias but also the coding table optimized in accordance with the context to perform the variable-length coding.

In step ST38, the entropy coding unit 15a performs the fixed-length coding. The entropy coding unit 15a performs the fixed-length coding on the bit plane and proceeds to step ST39.

In step ST39, the entropy coding unit 15a determines whether the processing is ended for all the bit depths. When the bit depth where the processing is not performed remains, the entropy coding unit 15a returns to step ST32 and performs the processing by inputting the bit plane at the new bit depth. On the other hand, the entropy coding unit 15a proceeds to step ST40 when the bit depth where the processing is not performed does not remain.

In step ST40, the entropy coding unit 15a determines whether the processing is ended for all the code blocks. When the code block where the processing is not performed remains, the entropy coding unit 15a returns to step ST31 and performs the processing by inputting the coefficient data of the new code block. On the other hand, when the code block where the processing is not performed does not remain, the entropy coding unit 15a ends the entropy coding processing.

In this manner, the entropy coding unit 15a uses the thresholds Thda and Thca in accordance with the context to perform the selection between the variable-length coding and the fixed-length coding. Furthermore, the entropy coding unit 15a uses not only the coefficient bits with the large bias but also the coding table optimized in accordance with the context to perform the variable-length coding. Therefore, the entropy coding unit 15a can further enhance the coding efficiency.

2-3. Configuration of Entropy Decoding Unit

Figure 15:
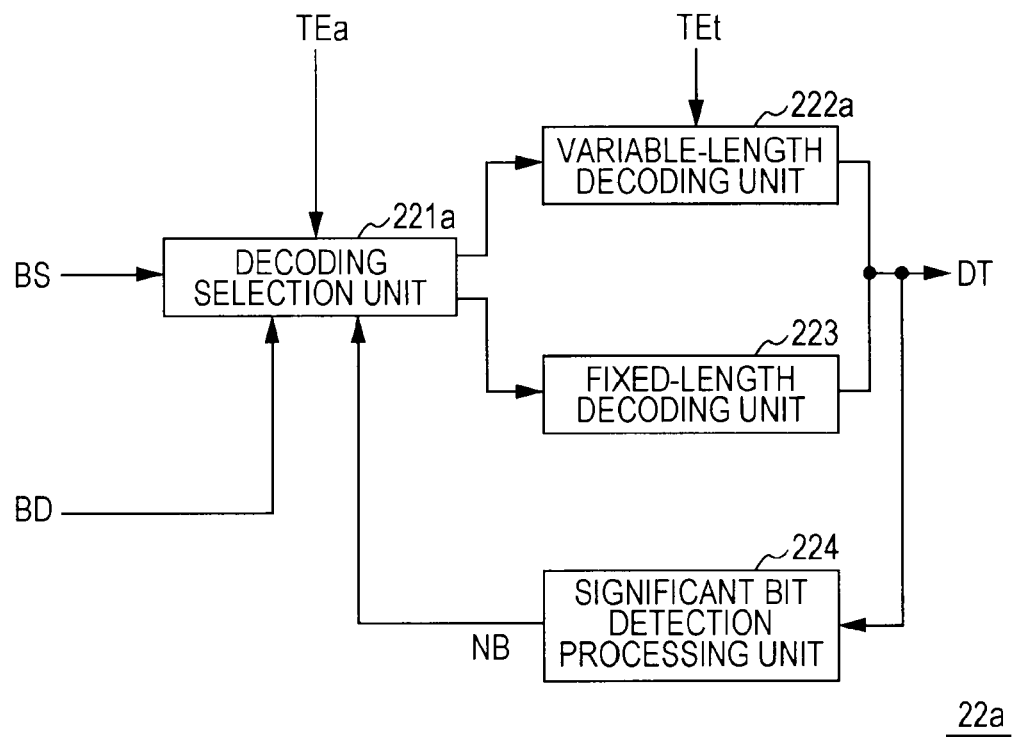
FIG. 15 illustrates a configuration of an entropy decoding unit.

FIG. 15 illustrates a configuration of the entropy decoding unit 22a. The entropy decoding unit 22a is provided with a decoding selection unit 221a, a variable-length decoding unit 222a, the fixed-length decoding unit 223, and the significant bit detection processing unit 224.

The decoding selection unit 221a selects either the variable-length decoding unit 222a or the fixed-length decoding unit 223 and outputs the coded data BS to the selected decoding unit. The decoding selection unit 221a performs the selection processing corresponding to the coding selection unit 152a of the entropy coding unit 15a and performs the decoding while switching from the variable-length decoding to the fixed-length decoding on the basis of a comparison result between the bit depth and the threshold Thda and/or a comparison result between the number of pieces of significant data NB on the bit plane by one higher-order and the threshold Thca. It should be noted that the threshold may be decided previously by the entropy coding unit and the entropy decoding unit, and also the threshold used in the entropy coding unit may be included in the header information. Also, for the threshold, similarly as in the coding, the threshold optimized in accordance with the context Tea is used.

The variable-length decoding unit 222a outputs the coefficient bit DT for the bit plane obtained by performing the variable-length decoding on the coded data BS to the significant bit detection processing unit 224 and the coefficient bit demodeling unit 23 illustrated in FIG. 9. Also, the variable-length decoding unit 222a uses the decoding table corresponding to the coding table used in the variable-length coding unit 153a of the entropy coding unit 15a to perform the variable-length decoding. That is, not only the coefficient bits with the large bias but also the decoding table optimized in accordance with the context TEt are used to perform the variable-length decoding.

The fixed-length decoding unit 223 outputs the coefficient bit DT for the bit plane obtained by performing the fixed-length decoding on the coded data to the coefficient bit demodeling unit 23 illustrated in FIG. 9.

The significant bit detection processing unit 224 detects the number of pieces of significant data NB from the coefficient bit DT for the bit plane output from the variable-length decoding unit 222a and outputs the number of pieces of significant data NB to the decoding selection unit 221a.

2-4. Operation of Entropy Decoding Unit

Figure 16:
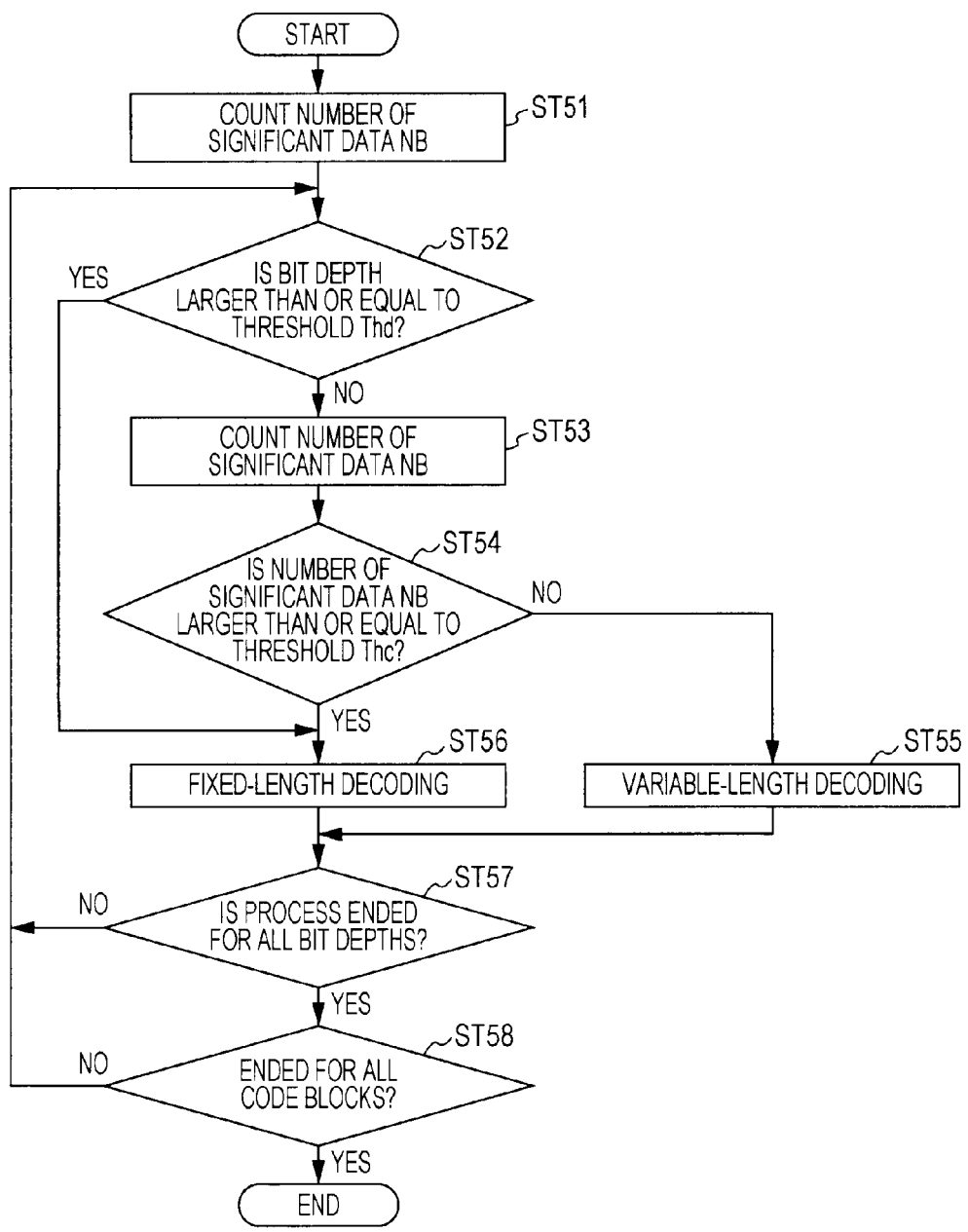
FIG. 16 is a flow chart for describing an operation of the entropy decoding unit.

FIG. 16 is a flow chart for describing an operation of the entropy decoding unit. It should be noted that FIG. 16 illustrates a case in which when the bit depth becomes larger than or equal to the threshold Thda or when the number of pieces of significant data NB becomes larger than or equal to the threshold Thca, the decoding is performed while switching from the variable-length decoding to the fixed-length decoding. It should be noted that the entropy decoding unit performs the switching from the variable-length decoding to the fixed-length decoding when the number of pieces of significant data NB on the bit plane by one higher-order becomes larger than or equal to the threshold Thca.

In step ST51, the entropy decoding unit 22a performs a setting in accordance with the context. The entropy decoding unit 22a sets the thresholds Thda and Thca optimized in accordance with the context. Also, the entropy decoding unit 22a performs a setting while using not only the coefficient bits with the large bias but also the coding table optimized in accordance with the context and proceeds to step ST52. It should be noted that the context may be decided previously by the entropy coding unit and the entropy decoding unit, and also the context may be included in the header information.

In step ST52, the entropy decoding unit 22a determines whether or not the bit depth is larger than or equal to the threshold Thda. When the bit depth of the coded data where the decoding is performed is smaller than the threshold Thda, the entropy decoding unit 22a proceeds to step ST53, and when the bit depth of the coded data is larger than or equal to the threshold Thda, the entropy decoding unit 22a proceeds to step ST56.

In step ST53, the entropy decoding unit 22a counts the number of pieces of significant data NB. The entropy decoding unit 22a selects the bit plane with the largest bit depth from the decoded bit plane and counts the number of pieces of significant data NB in the selected bit plane to proceeds to step ST54.

In step ST54, the entropy decoding unit 22a determines whether or not the number of pieces of significant data NB is larger than or equal to the threshold Thca. The entropy decoding unit 22a proceeds to step ST55 when the number of pieces of significant data NB is smaller than the threshold Thca, and when the number of pieces of significant data NB is larger than or equal to the threshold Thca, the entropy decoding unit 22a proceeds to step ST56.

In step ST55, the entropy decoding unit 22a performs the variable-length decoding. The entropy decoding unit 22a uses the variable-length decoding table corresponding to the variable-length coding table used in the entropy coding unit 15a, performs the variable-length decoding, generates the bit plane, and proceeds to step ST57.

In step ST56, the entropy decoding unit 22a performs the fixed-length decoding. The entropy decoding unit 22a uses the fixed-length decoding table corresponding to the fixed-length coding table used in the entropy coding unit 15a, performs the fixed-length decoding, generates the bit plane, and proceeds to step ST57.

In step ST57, the entropy decoding unit 22a determines whether or not the processing is ended for all the bit depths. When the bit depth where the decoding is not performed remains, the entropy decoding unit 22a returns to step ST52 and continues the decoding processing. Also, when the bit planes at the respective bit depths of the code block are obtained, the entropy decoding unit 22a proceeds to step ST58.

In step ST58, the entropy decoding unit 22a determines whether the processing is ended for all the code blocks. When the coded data where the decoding is not performed remains, the entropy decoding unit 22a returns to step ST52 and obtains the bit planes at the respective bit depths of the new code block by performing the decoding. On the other hand, the entropy decoding unit 22a ends the entropy decoding processing when the coded data where the processing is not performed does not remain.

When the above-mentioned decoding is performed by the entropy decoding unit 22a, even when the setting on the threshold and the coding table is performed in accordance with the context, it is possible to correctly perform the decoding on the coded data.

In this manner, according to the second embodiment, the selection between the variable-length coding and the fixed-length coding is adaptively performed in accordance with the context (the number of significant bits, bit depth, or the like). Also, in the variable-length coding, the variable-length coding table adaptive to the context is used. For that reason, in a case where the bias of the coefficient bit is large, the variable-length coding is performed by using the Huffman table optimized to the case, and in a case where the bias is small, the coding is performed through the fixed-length coding, so that the coding efficiency is enhanced. With this configuration, it is possible to further suppress the sense of discomfort or the sense of obscurity generated in the image which is caused by the post-quantization.

3. Case of Performing Coding and Decoding by Computer

The above-mentioned series of processings can be executed hardware and can also be executed by software. In a case where the series of processings is executed by the software, a computer having dedicated-use hardware in which a program structuring the software is incorporated is used. Alternatively, for example, a general-use personal computer or the like which is capable of executing various functions by installing various programs is used to install the software from a program recording medium.

Figure 17:
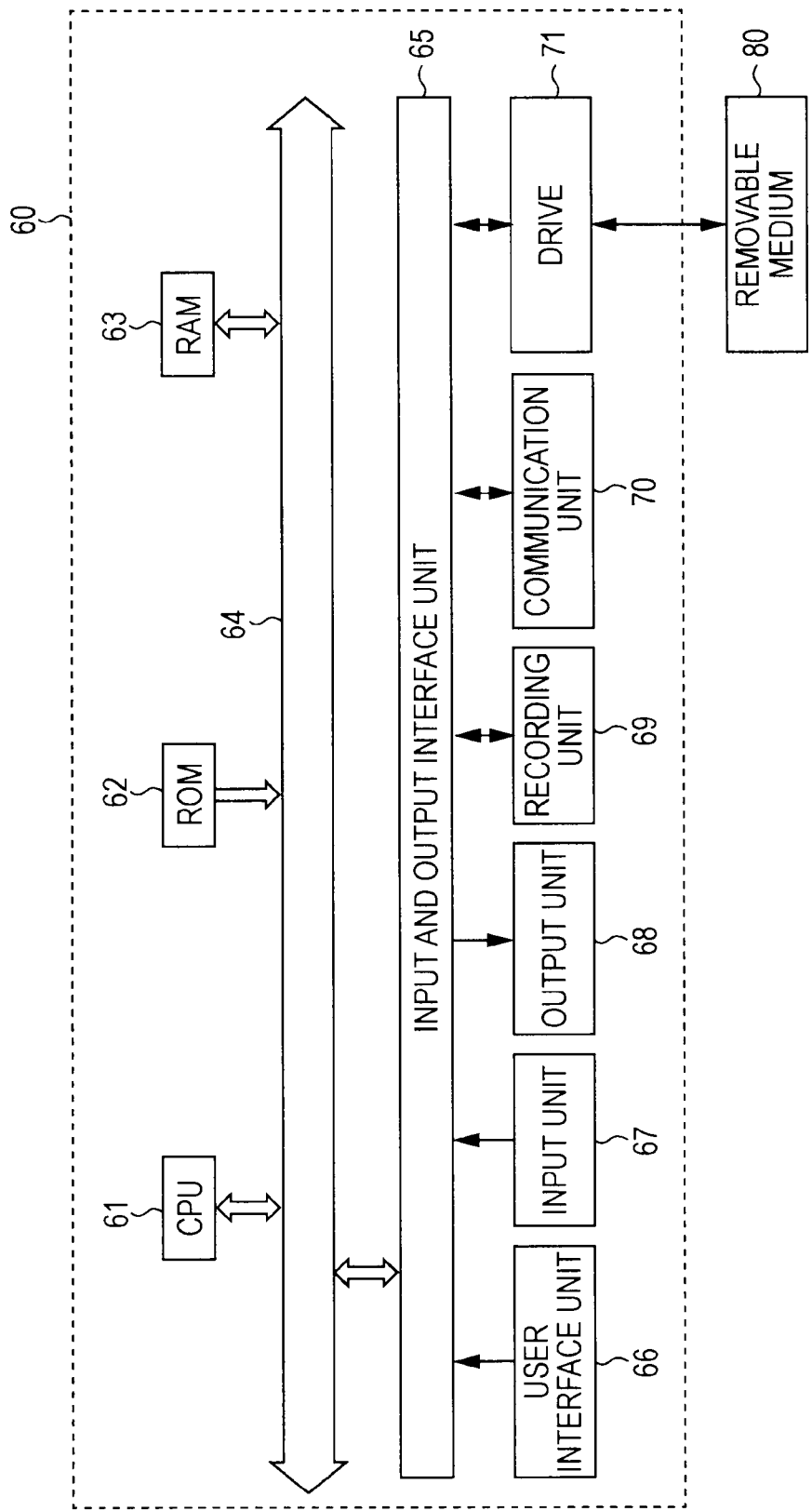
FIG. 17 illustrates a hardware configuration example of a computer.

FIG. 17 illustrates a hardware configuration example of a computer that executes the above-mentioned processings by programs.

In a computer 60, a CPU (Central Processing Unit) 61, a ROM (Read Only Memory) 62, and a RAM (Random Access Memory) 63 are mutually connected via a bus 64.

Furthermore, an input and output interface 65 is connected to the bus 64. To the input and output interface 65, a user interface unit 66 composed of a key board, a mouse, or the like, an input unit 67 for inputting image data, an output unit 68 composed of a display or the like, a recording unit 69 composed of a hard disk, a non-volatile memory, or the like, etc. are connected. Furthermore, to the input and output interface 65, a communication unit 70 composed of a network interface or the like and a drive 71 for driving a removable medium 80 such as a magnetic disk, an optical disk, an opto-magnetic disk, or a semiconductor memory are connected.

In the thus structured computer, the CPU 61 loads, for example, a program recorded in the recording unit 69 via the input and output interface 65 and the bus 64 onto the RAM 63 for execution, so that the above-mentioned series of processings is carried out.

The program executed by the computer (the CPU 61) is provided while being recorded, for example, on a magnetic disk (including a flexible disc), an optical disk (a CD-ROM (Compact Disc-Read Only Memory), a DVD(Digital Versatile Disc) or the like), an opto-magnetic disk, or the removable medium 80 serving as package media composed of a semiconductor memory or provided via a wired or wireless transmission medium such as a local area network, the internet, or digital satellite broadcasting.

Then, the program can be installed into the recording unit 69 via the input and output interface 65 by mounting the removable medium 80 to the drive 71. Also, the program can be received by the communication unit 70 via the wired or wireless transmission medium and installed into the recording unit 69. In addition, the program can be previously installed into the ROM 62 or the recording unit 69.

It should be noted that the program executed by the computer may be a program in which the processings are performed in a time-series manner in the order described in the present specification or a program in which the processings are performed in parallel or at an appropriate timing, for example, when a call is performed.

The present application contains subject matter related to that disclosed in Japanese Priority Patent Application JP 2010-059118 filed in the Japan Patent Office on Mar. 16, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image coding apparatus comprising:
a significant bit detection processing unit that detects a number of pieces of coefficient data where a significant bit is detected on a higher-order bit plane for each bit plane from coefficient data generated by performing a frequency transform on image data;
a coding selection unit that selects a variable-length coding or a fixed-length coding for each bit plane on the basis of the number of pieces of coefficient data and a bit depth of the bit plane;
a variable-length coding unit that performs a variable-length coding on the bit plane where the variable-length coding is selected; and
a fixed-length coding unit that performs a fixed-length coding on the bit plane where the fixed-length coding is selected, wherein
the variable-length coding unit performs the variable-length coding by using a coding table previously created on the basis of an occurrence probability of a coefficient bit, and
the coding selection unit selects the coding in sequence from a shallower bit depth, selects the fixed-length coding for the bit plane where the bit depth is larger than or equal to a first threshold and/or the number of pieces of coefficient data on a bit plane by one higher-order is larger than or equal to a second threshold, and selects the variable-length coding for the other bit plane.

2. The image coding apparatus according to claim 1, wherein the coding selection unit sets at least one of the first threshold and the second threshold in accordance with a context related to the image data.

3. An image coding method comprising:
detecting a number of pieces of coefficient data by a significant bit detection processing unit where a significant bit is detected on a higher-order bit plane for each bit plane from coefficient data generated by performing a frequency transform on image data;
selecting a variable-length coding or a fixed-length coding for each bit plane by a coding selection unit on the basis of the number of pieces of coefficient data and a bit depth of the bit plane;
performing a variable-length coding by a variable-length coding unit on the bit plane where the variable-length coding is selected; and
performing a fixed-length coding by a fixed-length coding unit on the bit plane where the fixed-length coding is selected, wherein
performing the variable-length coding includes using a coding table previously created on the basis of an occurrence probability of a coefficient bit, and
selecting the variable-length coding or the fixed length coding includes selecting the coding in sequence from a shallower bit depth, selecting the fixed-length coding for the bit plane where the bit depth is larger than or equal to a first threshold and/or the number of pieces of coefficient data on a bit plane by one higher-order is larger than or equal to a second threshold, and selecting the variable-length coding for the other bit plane.

4. A non-transitory computer-readable medium including a program for causing a computer to execute a processing comprising:
detecting a number of pieces of coefficient data where a significant bit is detected on a higher-order bit plane for each bit plane from coefficient data generated by performing a frequency transform on image data;
selecting a variable-length coding or a fixed-length coding for each bit plane on the basis of the number of pieces of coefficient data and a bit depth of the bit plane;
performing a variable-length coding on the bit plane where the variable-length coding is selected; and
performing a fixed-length coding on the bit plane where the fixed-length coding is selected, wherein
performing the variable-length coding includes using a coding table previously created on the basis of an occurrence probability of a coefficient bit, and
selecting the variable-length coding or the fixed length coding includes selecting the coding in sequence from a shallower bit depth, selecting the fixed-length coding for the bit plane where the bit depth is larger than or equal to a first threshold and/or the number of pieces of coefficient data on a bit plane by one higher-order is larger than or equal to a second threshold, and selecting the variable-length coding for the other bit plane.

* * * * *